United States Patent
Yamane et al.

(10) Patent No.: US 11,327,116 B2
(45) Date of Patent: May 10, 2022

(54) PULSE PATTERN GENERATION DEVICE

(71) Applicant: KABUSHIKI KAISHA TOYOTA JIDOSHOKKI, Kariya (JP)

(72) Inventors: Kazuki Yamane, Aichi-ken (JP); Masamichi Nawa, Aichi-ken (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 0 days.

(21) Appl. No.: 17/049,865

(22) PCT Filed: Apr. 19, 2019

(86) PCT No.: PCT/JP2019/016739
§ 371 (c)(1),
(2) Date: Oct. 22, 2020

(87) PCT Pub. No.: WO2019/208409
PCT Pub. Date: Oct. 31, 2019

(65) Prior Publication Data
US 2021/0239761 A1    Aug. 5, 2021

(30) Foreign Application Priority Data
Apr. 27, 2018  (JP) .............................. JP2018-087750

(51) Int. Cl.
*H02P 27/08*  (2006.01)
*G01R 31/34*  (2020.01)
(Continued)

(52) U.S. Cl.
CPC ............ *G01R 31/343* (2013.01); *H02M 7/48* (2013.01); *H02P 27/08* (2013.01); *H02P 29/50* (2016.02);
(Continued)

(58) Field of Classification Search
CPC .. H02P 29/50; H02P 2201/03; H02P 2205/01; G01R 31/343
See application file for complete search history.

(56) References Cited

U.S. PATENT DOCUMENTS

| 6,700,400 B2 * | 3/2004 | Atarashi | ................. B60L 50/51 |
| | | | 318/400.01 |
| 7,408,312 B2 * | 8/2008 | Itou | ........................ H02P 21/02 |
| | | | 318/400.02 |

(Continued)

FOREIGN PATENT DOCUMENTS

| JP | 09-191700 A | 7/1997 |
| JP | 2011-050121 A | 3/2011 |
| JP | 2016-005378 A | 1/2016 |

*Primary Examiner* — Rina I Duda
(74) *Attorney, Agent, or Firm* — Sughrue Mion, PLLC

(57) ABSTRACT

A pulse pattern generation device generating a pulse pattern for controlling switching elements provided in an inverter that operates a motor, the pulse pattern generation device includes a current calculation unit that calculates a current flowing through a coil when a voltage that is applied to the motor during the operation of the motor is virtually applied to the coil of the motor, an effective current calculation unit that calculates an effective current from the current calculated by the current calculation unit, an iron loss estimation unit that estimates an iron loss which originates in a core of the motor, and a pattern generation unit that generates a pulse pattern using an evaluation function including the iron loss estimated by the iron loss estimation unit and the effective current calculated by the effective current calculation unit as evaluation items.

6 Claims, 5 Drawing Sheets

(51) Int. Cl.
*H02M 7/48* (2007.01)
*H02P 29/50* (2016.01)

(52) U.S. Cl.
CPC ...... *H02P 2201/03* (2013.01); *H02P 2205/01* (2013.01)

(56) References Cited

U.S. PATENT DOCUMENTS

| | | |
|---|---|---|
| 2011/0050137 A1 | 3/2011 | Imura et al. |
| 2016/0028339 A1* | 1/2016 | Nakai .................... H02P 29/50 318/400.02 |
| 2016/0380576 A1* | 12/2016 | Sugahara ................ H02P 27/06 318/798 |

\* cited by examiner

PULSE PATTERN GENERATION DEVICE

CROSS REFERENCE TO RELATED APPLICATION

This application is a National Stage of International Application No. PCT/JP2019/016739 filed Apr. 19, 2019, claiming priority based on Japanese Patent Application No. 2018-087750 filed Apr. 27, 2018, the contents of all of which are incorporated herein by reference in their entirety.

TECHNICAL FIELD

The present invention relates to a pulse pattern generation device.

BACKGROUND ART

An inverter for driving a motor includes a plurality of switching elements. Direct current power is converted to alternating current power by executing switching control of these switching elements with a predetermined pulse pattern. The pulse pattern is set based on an evaluation function. The evaluation function is a numerical representation of the loss, and the like, which occurs when the motor is driven.

An inverter disclosed in Patent Document 1 is controlled by a pulse pattern set using an evaluation function including a harmonic voltage. The pulse pattern is set so that the harmonic voltage is minimized.

CITATION LIST

Patent Document

Patent Document 1: Japanese Patent Application Publication No 2016-5378

SUMMARY OF INVENTION

Technical Problem

When the harmonic voltage is reduced, iron loss of the motor is reduced. Therefore, the iron loss of the motor may be reduced by controlling the inverter with the pulse pattern of Patent Document 1. However, the pulse pattern disclosed in Patent Document 1 cannot reduce copper loss.

It is an objective of the present invention to provide a pulse pattern generation device that can generate a pulse pattern that reduces copper loss.

Solution to Problem

A pulse pattern generation device for solving the above problem is a pulse pattern generation device generating a pulse pattern for controlling a plurality of switching elements provided in an inverter that operates a motor, the pulse pattern generation device including: a current calculation unit that calculates a current flowing through a coil when a voltage that is applied to the motor during the operation of the motor is virtually applied to the coil of the motor; an effective current calculation unit that calculates an effective current from the current calculated by the current calculation unit; an iron loss estimation unit that estimates iron loss which originates in a core of the motor; and a pattern generation unit that generates a pulse pattern using an evaluation function, the evaluation function including the iron loss estimated by the iron loss estimation unit and the effective current calculated by the effective current calculation unit as evaluation items.

The effective current affects copper loss, which is a loss caused by a coil, and the copper loss may be reduced by reducing the effective current. Generating a pulse pattern using the evaluation function that includes the effective current permits generating a pulse pattern in which copper loss is taken into consideration. Copper loss may be reduced by switching control of the switching elements of the inverter with this pulse pattern.

According to the pulse pattern generation device, the evaluation function may be the following expression (1).

[Formula 1]

$$\sqrt{a \cdot I_{rms}^2 + b \cdot W_i^2} \qquad (1)$$

where a and b each represent a weight adjustment coefficient, $I_{rms}$ represents an effective current, and $W_i$ represents an iron loss.

According to this, the weight adjustment coefficients permits determining which evaluation item is emphasized while both the effective current and the iron loss are reduced.

Advantageous Effects of Invention

According to the present invention, a pulse pattern that reduces copper loss can be generated.

DESCRIPTION OF EMBODIMENTS

Figure 1:
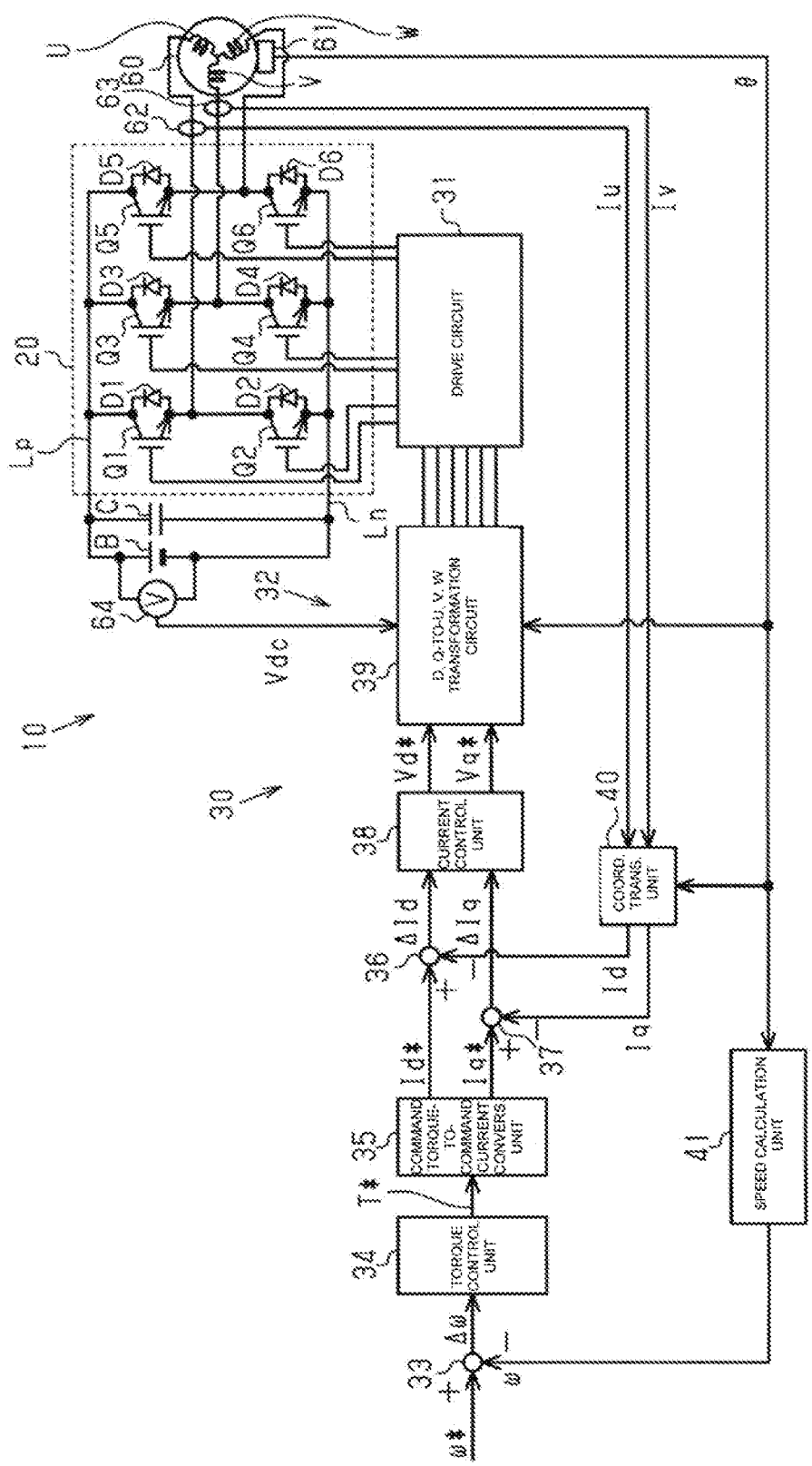
FIG. 1 is a block diagram illustrating a motor and an inverter for driving the motor.

The following will describe an embodiment of a pulse pattern generation device. As shown in FIG. 1, an inverter 10 includes an inverter circuit 20 and an inverter control device 30. The inverter control device 30 includes a drive circuit 31 and a control unit 32. The inverter 10 of the present embodiment is configured to drive a motor 60.

The inverter circuit 20 includes six switching elements Q1 to Q6 and six diodes D1 to D6. IGBT is used for the switching elements Q1 to Q6. The switching element Q1 configuring a U-phase upper arm and the switching element Q2 configuring a U-phase lower arm are connected in series between a positive bus Lp and a negative bus Ln. The switching element Q3 configuring a V-phase upper arm and the switching element Q4 configuring a V-phase lower arm are connected in series between the positive bus Lp and the negative bus Ln. The switching element Q5 configuring a W-phase upper arm and the switching element Q6 configuring a W-phase lower arm are connected in series between the positive bus Lp and the negative bus Ln. Each of the switching elements Q1 to Q6 is connected in antiparallel with a corresponding one of the diodes D1 to D6. A battery B as a direct current power source is connected to the positive bus Lp and the negative bus Ln with a smoothing capacitor C interposed therebetween.

A node between the switching element Q1 and the switching element Q2 is connected to a U-phase terminal of a motor 60. A node between the switching element Q3 and the switching element Q4 is connected to a V-phase terminal of the motor 60. A node between the switching element Q5 and the switching element Q6 is connected to a W-phase terminal of the motor 60. The inverter circuit 20, which has the switching elements Q1 to Q6 configuring the upper and lower arms, converts a direct current voltage to an alternating current voltage by switching operation of the switching elements Q1 to Q6, and supplies the alternating current voltage to the motor 60, the direct current voltage being a voltage of the battery B. The motor 60 has three coils U, V and W which are star-connected. Any type of motors such as an induction motor, an IPM motor, and a SPM motor may be used as the motor 60.

The drive circuit 31 is connected to gate terminals of the switching elements Q1 to Q6. The drive circuit 31 executes the switching operation of the switching elements Q1 to Q6 of the inverter circuit 20 based on control signals.

The inverter 10 includes a position detection unit 61 that detects an electric angle θ of the motor 60, a current sensor 62 that detects a U-phase current Iu of the motor 60, a current sensor 63 that detects a V-phase current Iv of the motor 60, and a current sensor 64 that detects a power source voltage Vdc.

The control unit 32 is configured by a microcomputer. The control unit 32 includes a subtraction unit 33, a torque control unit 34, a command torque-to-command current conversion unit 35, a subtraction unit 36, a subtraction unit 37, a current control unit 38, a d, q-to-u, v, w transformation circuit 39, a coordinate transformation unit 40, and a speed calculation unit 41.

The speed calculation unit 41 calculates a speed ω from the electric angle θ detected by the position detection unit 61. The subtraction unit 33 calculates a difference Δω between a command speed ω* and the speed ω calculated by the speed calculation unit 41. The torque control unit 34 calculates a command torque T* from the difference Δω of the speed ω.

The command torque-to-command current conversion unit 35 converts a command torque T* to a d-axis command current Id* and a q-axis command current Iq*. For example, the command torque-to-command current conversion unit 35 executes a command torque-to-command current conversion using a table, which holds values of the target torque in relation to the d-axis command current Id* and the q-axis command current Iq*, stored in advance in a storage unit (not shown).

The coordinate transformation unit 40 obtains a W-phase current Iw of the motor 60 from the U-phase current Iu and the V-phase current Iv measured by the current sensors 62 and 63, respectively, and performs coordinate transformation from three-phase system (u, v, w) with the U-phase current Iu, the V-phase current Iv, and the W-phase current Iw to two-phase system (d, q) with a d-axis current Id and a q-axis current Iq based on the electric angle θ detected by the position detection unit 61. It is noted that the d-axis current Id is a current vector component to generate the magnetic flux at the motor 60 and the q-axis current Iq is a current vector component to generate torque at the motor 60.

The subtraction unit 36 calculates a difference ΔId between the d-axis command current Id* and the d-axis current Id. The subtraction unit 37 calculates a difference ΔIq between the q-axis command current Iq* and the q-axis current Iq. The current control unit 38 calculates the d-axis command voltage Vd* and the q-axis command voltage Vq* based on the difference ΔId and the difference ΔIq, respectively.

The d, q-to-u, v, w transformation circuit 39 receives the electric angle θ, the d-axis command voltage Vd*, the q-axis command voltage Vq*, and the power source voltage Vdc, and outputs a control signal to control each of the switching elements Q1 to Q6 to the drive circuit 31.

Figure 2:
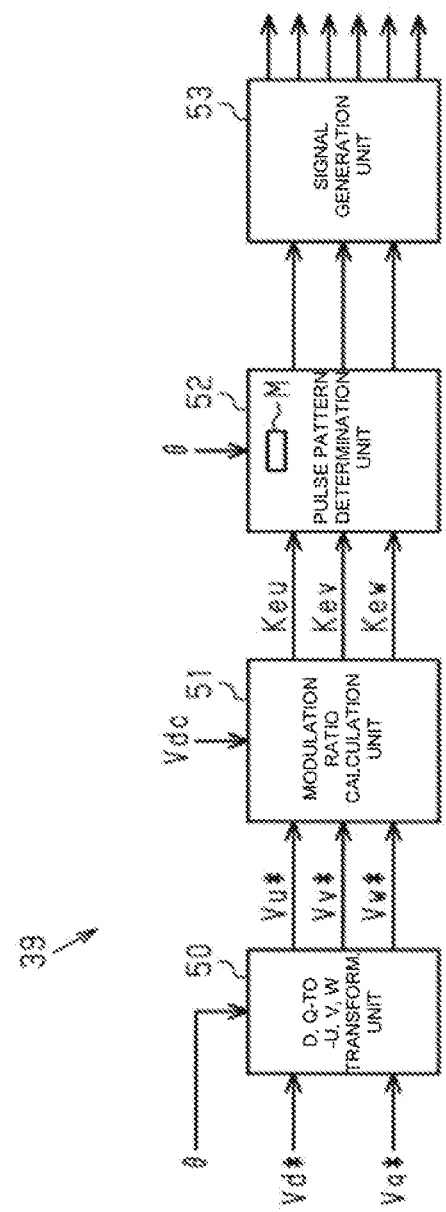
FIG. 2 is a block diagram illustrating a configuration of a d, q-to-u, v, w transformation circuit.

As shown in FIG. 2, the d, q-to-u, v, w transformation circuit 39 includes a d, q-to-u, v, w transformation unit 50, a modulation ratio calculation unit 51, a pulse pattern determination unit 52, and a signal generation unit 53.

The d, q-to-u, v, w transformation unit 50 executes a coordinate transformation from the d-axis command voltage Vd* and the q-axis command voltage Vq* to a U-phase command voltage Vu*, a V-phase command voltage Vv*, and a W-phase command voltage Vw* based on the electric angle θ representing angle information (the position of the rotor).

The modulation ratio calculation unit 51 calculates modulation ratios Keu, Kev, Kew based on the command voltages Vu*, Vv*, Vw* and the power source voltage Vdc. The modulation ratio calculation unit 51 are ratios of the command voltage (voltage amplitude) Vu*, Vv*, Vw* to the power source voltage Vdc obtained by dividing the command voltage Vu*, Vv*, Vw* by the power source voltage Vdc.

The pulse pattern determination unit 52 determines pulse patterns, which are switching patterns of the switching elements Q1 to Q6, based on the electric angle θ and the modulation ratios Keu, Ke, Kew. The pulse pattern is stored as a map M in a storage unit such as a memory. The pulse patterns are set in relation to the electric angle θ and the modulation ratios Keu, Ke, Kew.

Figure 3:
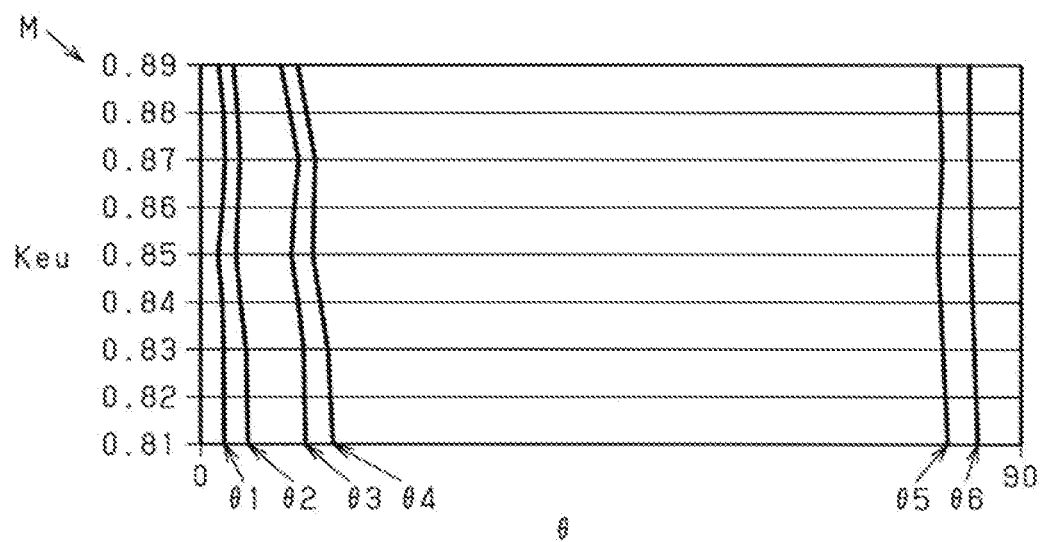
FIG. 3 is a chart showing an example of a map.

As shown in FIG. 3, the map M is information in which an on-command signal and an off-command signal are associated with the electric angle θ and the modulation ratio Keu, Key, Kew. In FIG. 3, an example of the map M in which an on-command signal and an off-command signal are associated with the U-phase modulation ratio Keu and the electric angle θ is shown. The on-command signal is a signal that gives a command to turn on the upper arm switching elements Q1, Q3, Q5, and to turn off the lower arm switching elements Q2, Q4, Q6. The off-command signal is a signal that gives a command to turn off the upper arm switching elements Q1, Q3, Q5 and to turn on the lower arm switching element Q2, Q4, Q6.

The map M indicates a pulse angle which is the electric angle θ that gives an instruction of switching from the on-command signal to the off-command signal and switching from the off-command signal to the on-command signal. FIG. 3 shows pulse angles θ1, θ2, θ3, θ4, θ5, θ6 as the pulse angles at which the on-command signal and the off-command signal are switched.

FIG. 3 shows a part of the map M of the u-phase for the electric angle θ between 0 degrees and 90 degrees. When the map M is reflected line-symmetrically at a position at the electric angle θ of 0 degrees in FIG. 3, the reflected map M corresponds to a map between 0 degrees and −90 degrees.

When a map of the electric angle θ between −90 degrees and 90 degrees is reflected point-symmetrically at a point of the electric angle θ of 0 degrees, the reflected map corresponds to a map between 90 degrees and 270 degrees. The map M of the V-phase and the map M of the W-phase are obtained by shifting the electrical angle θ by 120 degrees and by 240 degrees, respectively, with respect to the map M of the U-phase.

The signal generation unit 53 generates a control signal based on the pulse pattern determined by the pulse pattern determination unit 52. The signal generation unit 53 sets dead times for switching on and off of the upper arm switching elements Q1, Q3, Q5 and the lower arm switching elements Q2, Q4, Q6, and generates a control signal based on the pulse pattern. Thus, the switching control of the switching elements Q1 to Q6 of the inverter 10 is executed with the predetermined pulse pattern.

Figure 4:
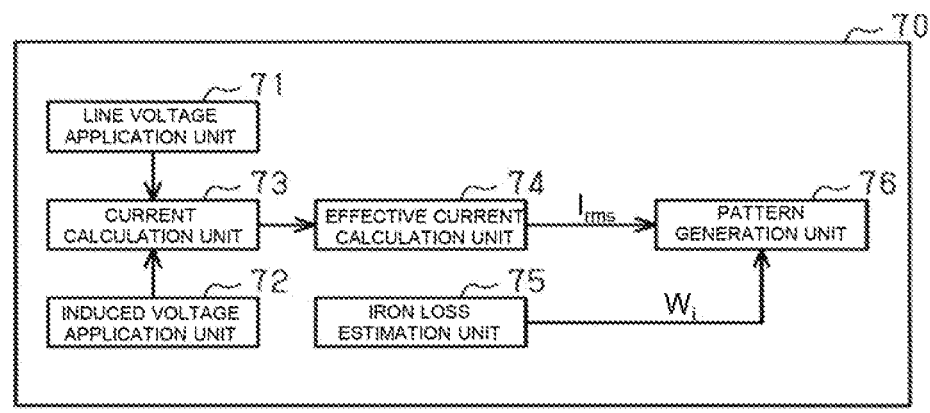
FIG. 4 is a block diagram showing a pulse pattern generation device.

The following will describe the pulse pattern generation device that generates the above-mentioned pulse pattern. As shown in FIG. 4, the pulse pattern generation device 70 includes a line voltage application unit 71 that applies a line voltage to coils of the motor 60, and an induced voltage application unit 72 that applies an induced voltage to the coils of the motor 60. The coils includes two coils to which the line voltage is applied, and correspond to the coil U of U-phase and the coil V of V-phase in the present embodiment. The pulse pattern generation device 70 is a device configured to generate a pulse pattern by simulating driving conditions of the motor 60.

The line voltage application unit 71 virtually applies the line voltage, which is a voltage applied to the coils U, V when the motor 60 is driven, to the coils U, V. The induced voltage application unit 72 virtually applies the induced voltage, which is generated when the motor 60 is driven, to the coils U, V. The line voltage is set by the voltage of the battery B. The induced voltage is derived from the analysis, the actual measurement, and the like. For example, the induced voltage can be derived by using magnetic field analysis to calculate the voltage generated when the motor 60 is rotated, or by measuring the terminal of the motor 60 with a measuring device such as an oscilloscope. The direction of the current when the line voltage is applied to the coils U, V is opposite to that of the current when the induced voltage is applied to the coils U, V.

The pulse pattern generation device 70 includes a current calculation unit 73 that calculates a current i that flows when the line voltage and the induced voltage is applied to U, V, and an effective current calculation unit 74 that calculates an effective current from the current i. The current calculation unit 73 calculates the current i using the following expression (2)

[Formula 2]

$$i = \int \frac{\text{line voltage} - \text{induced voltage}}{L} dt + i_0 \quad (2)$$

where L represents a combined inductance of the coil U and the coil V, and $i_0$ represents a current flowing through the coils U, V at time t=0.

As can be understood from the expression (2), the current i is calculated with the induced voltage taken into consideration in addition to the line voltage. The slope of the waveform of the current i changes depending on the magnitude relationship between the line voltage and the induced voltage.

The effective current calculation unit 74 calculates an effective current $I_{rms}$ from the current waveform obtained by the current i calculated by the current calculation unit 73. Since the current i is obtained with the induced voltage taken into consideration, the current waveform more similar to the actual driving condition of the motor 60 may be obtained, as compared to a current waveform obtained without considering the induced voltage. Specifically, in a case where the induced voltage is taken into consideration, the line voltage becomes smaller than the induced voltage when the line voltage is 0 (V), so that the slope of the current becomes negative. On the other hand, in a case where the induced voltage is not taken into consideration, the value of the current is maintained when the line voltage is 0 (V) because the current resulting from the induced voltage is not considered. Thus, the slope becomes 0. In this way, the current waveforms vary depending on whether or not the induced voltage is taken into consideration.

The pulse pattern generation device 70 includes an iron loss estimation unit 75 that estimates iron loss. The iron loss estimation unit 75 estimates an iron loss $W_i$ of a core of the motor 60, that is, a loss originating in the rotor core and the stator core. The iron loss $W_i$ is estimated using the following expression (3).

[Formula 3]

$$w_i = \sum \frac{V_n^2}{n} \quad (3)$$

where $V_n$ represents a harmonic voltage, and n represents a harmonic order.

The pulse pattern generation device 70 includes a pattern generation unit 76. The pattern generation unit 76 generates a pulse pattern using an evaluation function including the effective current $I_{rms}$ and the iron loss $W_i$ as evaluation items. The evaluation function is a numerical representation of the evaluation items, and the evaluation function of the present embodiment is the following expression (1).

[Formula 4]

$$\sqrt{a \cdot I_{rms}^2 + b \cdot W_i^2} \quad (1)$$

where a and b each represent a weight adjustment coefficient, $I_{rms}$ represents an effective current, and $W_i$ represents an iron loss.

The weight adjustment coefficients a, b are arbitrary coefficients. By setting the values of the weight adjustment coefficients a, b, it is possible to arbitrarily set which one of the effective current $I_{rms}$ and the iron loss W should be emphasized. The effective current $I_{rms}$ affects the copper loss, which is a loss caused by the coils U, V, W, and the copper loss may be reduced by reducing the effective current $I_{rms}$. For a motor 60 in which the iron loss W is greater than the copper loss, the iron loss $W_i$ is reduced by increasing the weight adjustment coefficient b to reduce the iron loss $W_i$. For a motor 60 in which the copper loss is greater than the iron loss $W_i$, the copper loss is reduced by increasing the weight adjustment coefficient a to reduce the copper loss the copper loss is reduced by increasing the weight adjustment coefficient a to reduce the copper loss. In this way, the weight adjustment coefficients a, b are set depending on types of the motor 60 and the characteristics of the motor 60.

The evaluation items of the present embodiment all relate to the loss of the motor 60. Therefore, it can be said that the pulse pattern with the smaller evaluation function is a pulse pattern reducing the loss more. The pattern generation unit 76 generates a pulse pattern so that the values of the evaluation function becomes minimum. Accordingly, the map M of the pulse pattern may be obtained.

The following will describe the operation of the present embodiment. The switching control of the switching elements Q1 to Q6 of the inverter 10 is executed with the pulse pattern generated by the pulse pattern generation device 70. This pulse pattern is set so that the evaluation function based on the effective current $I_{rms}$ and the iron loss W becomes minimum. By executing the switching control of the switching elements Q1 to Q6 with this pulse pattern, the switching operation is executed so that both the effective current $I_{rms}$ and the iron loss $W_i$ become smaller. In other words, based on the weight adjustment coefficients a, b, both the copper loss and the iron loss $W_i$ may be reduced while the copper loss and the iron loss are balanced.

Figure 5:
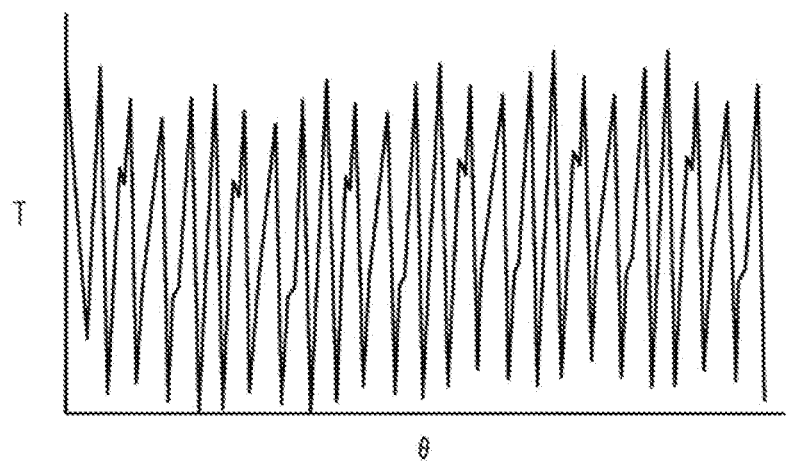
FIG. 5 is a chart showing a waveform of a torque when switching control of switching elements is executed with a pulse pattern generated using an evaluation function without an effective current.

As shown in FIG. 5, if the switching control of the switching elements Q1 to Q6 is executed with a pulse pattern generated using an evaluation function without the effective current $I_{rms}$, a current harmonic becomes large, and a torque ripple becomes large.

Figure 6:
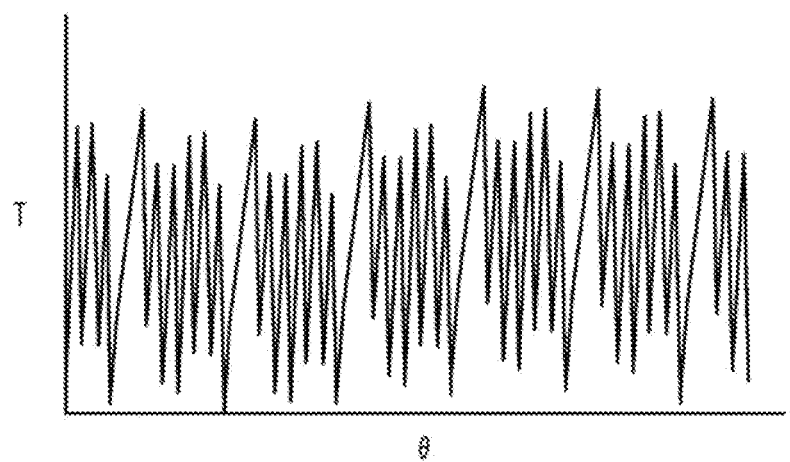
FIG. 6 is a chart showing a waveform of a torque when switching control of switching elements is executed with a pulse pattern generated using an evaluation function of an embodiment.

As shown in FIG. 6, if the switching control of the switching elements Q1 to Q6 is executed with a pulse pattern generated using the evaluation function of the present embodiment, a current harmonic becomes small due to the smaller effective current $I_{rms}$. In the torque waveform shown in FIG. 6, the torque ripple is smaller than in the torque waveform shown in FIG. 5.

The following will describe the effects of the present embodiment.

(1) The pattern generation unit 76 generates a pulse pattern using the evaluation function including the effective current $I_{rms}$ and the iron loss $W_i$ as evaluation items. By generating a pulse pattern using the evaluation function including the effective current $I_{rms}$ in addition to the iron loss $W_i$, a pulse pattern in which not only the iron loss but the copper loss are taken into consideration is generated. Copper loss may be reduced by executing the switching control of the switching elements Q1 to Q6 of the inverter 10 with this pulse pattern.

(2) The evaluation function permits selecting which one of the weight adjustment coefficients a, b should be emphasized while including both the effective current $I_{rms}$ and the iron loss $W_i$ as the evaluation items. Thus, a pulse pattern suitable for the motor 60 may be generated.

The present embodiment may be modified in various manners, as exemplified below. The present embodiment and the following modification examples may be combined within the scope as long as it is technically consistent.

Figure 7:
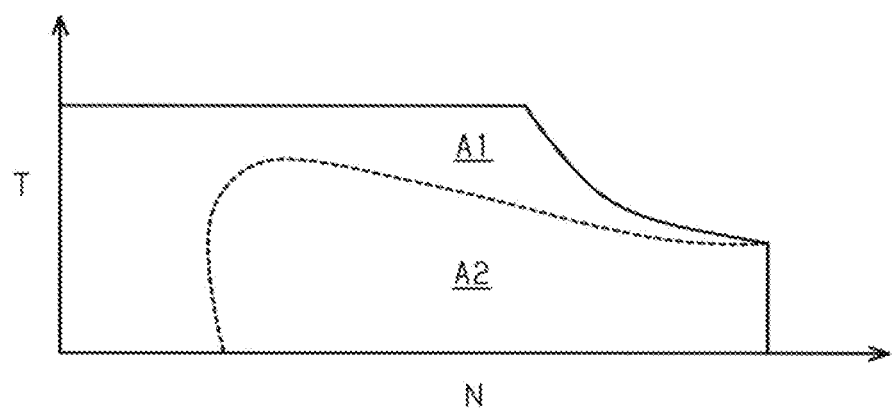
FIG. 7 is a schematic chart showing a first region where a copper loss is dominant and a second region where an iron loss is dominant in relation to the torque of the motor and the number of rotations of the motor.

The weight adjustment coefficients a, b may be changed depending on the torque T of the motor 60 and the number of rotations N of the motor 60. As shown in FIG. 7, the NT region defined by the torque T and the number of rotations N may be divided into a first region A1 where the copper loss is dominant and a second region A2 where the iron loss $W_i$ is dominant. Thus, in the first region A1 where the copper loss is dominant, the weight adjustment coefficients a, b are set so that $a \cdot I_{rms}^2 > b \cdot W_i^2$ is satisfied. On the other hand, in the second region A2 where the iron loss $W_i$ is dominant, the weight adjustment coefficients a, b are set so that $a \cdot I_{rms}^2 < b \cdot W_i^2$ is satisfied. This allows the pattern generation unit 76 to generate a pulse pattern corresponding to the torque T and the number of rotations N.

The weight adjustment coefficients a, b may be changed depending on the phase current. For example, a threshold value is set for the phase current and the weight adjustment coefficients a, b are set so that $a \cdot I_{rms}^2 < b \cdot W_i^2$ is satisfied when the phase current is equal to or less than the threshold value. When the phase current is greater than the threshold, the weight adjustment coefficients a, b are set so that $a \cdot I_{rms}^2 < b \cdot W_i^2$ is satisfied. As the threshold value, a value at which the magnitude relationship of the copper loss and the iron loss $W_i$ is determined, or the like, is used. This allows the pattern generation unit 76 to generate a pulse pattern corresponding to the phase current.

Additional evaluation items may be added to the evaluation function as in the following expression (4).

[Formula 5]

$$\sqrt{a \cdot I_{rms}^2 + b \cdot W_i^2 + c \cdot x^2} \qquad (4)$$

where c represents a weight adjustment coefficient and x represents an arbitrary evaluation item. For example, the neutral point potential of the motor 60 (coil U, coil V, coil W), or conductive noise is set as x. Accordingly, the evaluation function may be modified as long as the evaluation function includes at least the effective current $I_{rms}$ and the iron loss $W_i$.

The evaluation function is not limited to the expression (1), but may be changed as long as it includes the iron loss $W_i$ and the effective current $I_{rms}$ as the evaluation items.

The effective current $I_{rms}$ may be obtained from the current that flows when the line voltage is applied to the coils U, V without considering the inductive voltage. In this case, it is preferable to use the induction motor as the motor 60.

The pulse pattern generation device 70 may be mounted to the inverter 10. In this case, a detection unit that detects the degradation of the coils U, V and an estimation unit that estimates the degradation are provided to correct for the inductance of the coils U, W used for generating the pulse pattern. This permits generating a pulse pattern with the degradation of the coils U, V taken into consideration. The pulse pattern is renewed depending on the degradation of the coils U, V, so that the switching control of the switching elements Q1 to Q6 can be executed with the pulse pattern suitable for the inverter 10.

The pattern generation unit 76 is not limited to generate a pulse pattern that minimizes the evaluation function, but may be configured to generate a pulse pattern that can output an arbitrary current waveform.

The iron loss estimation unit 75 may be configured to estimate the iron loss $W_i$ using an expression other than the expression (3).

The modulation ratio for only one phase may be calculated. In this case, the modulation ratio for one phase is considered as the modulation ratio common to three phases while it is controlled.

The pulse pattern generation device 70 may be configured to generate a pulse pattern for driving a three-phase alternating current motor in which three coils U, V, W are delta-connected. In this case, the current calculation unit 73 calculates a current (phase current) that flows when the phase voltage and induced voltage are applied to one phase. Thus, the pattern generation unit 76 generates a pulse pattern from the effective current obtained from the current.

REFERENCE SIGNS LIST

Q1 to Q6
U, V, W coil 10 inverter
60 motor
70 pulse pattern generation device
71 line voltage application unit
73 current calculation unit
74 effective current calculation unit
75 iron loss estimation unit
76 pattern generation unit

The invention claimed is:

1. A pulse pattern generation device generating a pulse pattern for controlling a plurality of switching elements provided in an inverter that operates a motor, the pulse pattern generation device comprising:
   a current calculation unit that calculates a current flowing through a coil when a voltage that is applied to the motor during an operation of the motor is virtually applied to the coil of the motor;
   an effective current calculation unit that calculates an effective current from the current calculated by the current calculation unit;
   an iron loss estimation unit that estimates an iron loss which originates in a core of the motor; and
   a pattern generation unit that generates the pulse pattern to reduce a resulting value of an evaluation function, which includes the iron loss estimated by the iron loss estimation unit and the effective current calculated by the effective current calculation unit, as variables of the evaluation function,
   wherein the pattern generation unit sets a first weight adjustment coefficient and a second weight adjustment coefficient that are applied to the effective current and the iron loss of the evaluation function, respectively, based on a characteristic of the motor related to a combination of a copper loss and the iron loss.

2. The pulse pattern generation device according to claim 1, wherein
   the evaluation function is the following expression (1)
   $$\sqrt{a \cdot I_{rms}^2 + b \cdot W_i^2} \tag{1}$$
   where a represents the first weight adjustment coefficient, b represents the second weight adjustment coefficient, $I_{rms}$ represents the effective current, and $W_i$ represents the iron loss.

3. The pulse pattern generation device according to claim 2, wherein:
   when the copper loss is more dominant than the iron loss, the pattern generation unit sets a and b so that $a \cdot I_{rms}^2$ is greater than $b \cdot W_i^2$, and
   when the iron loss is more dominant than the copper loss, the pattern generation unit sets a and b so that $a \cdot I_{rms}^2$ is less than $b \cdot W_i^2$.

4. The pulse pattern generation device according to claim 1, wherein the pattern generation unit sets the first weight adjustment coefficient and the second weight adjustment coefficient that are applied to the effective current and the iron loss of the evaluation function, respectively, based on a torque of the motor and a number of rotations of the rotator.

5. The pulse pattern generation device according to claim 1, wherein the pattern generation unit increases the second weight adjustment coefficient that is applied to the iron loss of the evaluation function based on the characteristic of the motor in which the iron loss is greater than the copper loss.

6. The pulse pattern generation device according to claim 1, wherein the pattern generation unit increases the first weight adjustment coefficient that is applied to the effective current of the evaluation function based on the characteristic of the motor in which the copper loss is greater than the iron loss.

* * * * *